United States Patent
Iguchi

(10) Patent No.: US 9,640,477 B1
(45) Date of Patent: May 2, 2017

(54) SEMICONDUCTOR PACKAGE AND METHOD OF PRODUCING THE SEMICONDUCTOR PACKAGE

(71) Applicant: FUJI XEROX CO., LTD., Tokyo (JP)

(72) Inventor: Daisuke Iguchi, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/244,099

(22) Filed: Aug. 23, 2016

(30) Foreign Application Priority Data

Mar. 4, 2016 (JP) ................................. 2016-042626

(51) Int. Cl.
| | |
|---|---|
| *H01L 23/52* | (2006.01) |
| *H01L 23/522* | (2006.01) |
| *H01L 21/48* | (2006.01) |
| *H01L 21/56* | (2006.01) |
| *H01L 23/538* | (2006.01) |
| *H01L 23/31* | (2006.01) |

(52) U.S. Cl.
CPC ........ *H01L 23/5223* (2013.01); *H01L 21/486* (2013.01); *H01L 21/4857* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 23/5389* (2013.01)

(58) Field of Classification Search
CPC .................................................. H01L 23/5223
See application file for complete search history.

(56) References Cited

U.S. PATENT DOCUMENTS

| | | | | |
|---|---|---|---|---|
| 2004/0257749 | A1* | 12/2004 | Otsuka | H01G 2/065 361/306.3 |
| 2005/0231889 | A1 | 10/2005 | Tsuji | |
| 2013/0228895 | A1* | 9/2013 | Iguchi | H01L 28/40 257/532 |
| 2014/0048906 | A1* | 2/2014 | Shim, II | H01L 23/481 257/531 |
| 2016/0329262 | A1* | 11/2016 | Hsiao | H01L 23/3114 |

FOREIGN PATENT DOCUMENTS

| | | |
|---|---|---|
| JP | 2005-310814 A | 11/2005 |
| JP | 5389971 B2 | 1/2014 |

OTHER PUBLICATIONS

Naoki Hayashi, et al., "A Novel Wafer Level Fan-out Package (WFOP™) Applicable to 50um Pad Pitch Interconnects", 2011 13$_{th}$ Electronics Packaging Technology Conference, 2011, pp. 1-4.

* cited by examiner

*Primary Examiner* — Daniel Whalen
(74) *Attorney, Agent, or Firm* — Sughrue Mion, PLLC

(57) ABSTRACT

A method of producing a semiconductor package includes planarizing a surface extending from at least part of connection regions to a pair of terminals by disposing a semiconductor element and a capacitor element such that the semiconductor element and the capacitor element do not overlap each other in plan view of the semiconductor element, and by filling a portion between the semiconductor element and the capacitor element with an insulator layer; directly connecting part of the connection regions and one of the pair of terminals to a first metal layer by forming the first metal layer on top of the connection regions, on top of the pair of terminals, and on top of the insulator layer; forming a dielectric layer on top of the first metal layer; and forming a capacitor layer by forming a second metal layer on top of the dielectric layer.

14 Claims, 8 Drawing Sheets

SEMICONDUCTOR PACKAGE AND METHOD OF PRODUCING THE SEMICONDUCTOR PACKAGE

CROSS-REFERENCE TO RELATED APPLICATIONS

This application is based on and claims priority under 35 USC 119 from Japanese Patent Application No. 2016-042626 filed Mar. 4, 2016.

BACKGROUND

Technical Field

The present invention relates to a semiconductor package and a method of producing the semiconductor package.

SUMMARY

According to an aspect of the invention, there is provided a method of producing a semiconductor package, including planarizing a surface that extends from at least part of connection regions to a pair of terminals by disposing a semiconductor element that includes the connection regions at a surface thereof and a capacitor element that includes the pair of terminals such that the semiconductor element and the capacitor element do not overlap each other in plan view of the semiconductor element, and by filling a portion between the semiconductor element and the capacitor element with an insulator layer, the capacitor element supplying electric current to the semiconductor element, the connection regions being where a circuit element is provided and being provided for connecting the circuit element to an outside, the pair of terminals being provided for connection to an outside; directly connecting part of the connection regions and one of the pair of terminals to a first metal layer by forming the first metal layer on top of the connection regions, on top of the pair of terminals, and on top of the insulator layer; forming a dielectric layer on top of the first metal layer; and forming a capacitor layer by forming a second metal layer on top of the dielectric layer, the capacitor layer including the first metal layer, the dielectric layer, and the second metal layer.

BRIEF DESCRIPTION OF THE DRAWINGS

Exemplary embodiments of the present invention will be described in detail based on the following figures, wherein.

DETAILED DESCRIPTION

Exemplary embodiments according to the present invention are hereunder described in detail with reference to the drawings.

First Exemplary Embodiment

A semiconductor package 10 and a method of producing the semiconductor package 10 according to an exemplary embodiment are described with reference to FIGS. 1A to 4B.

Figure 1A:
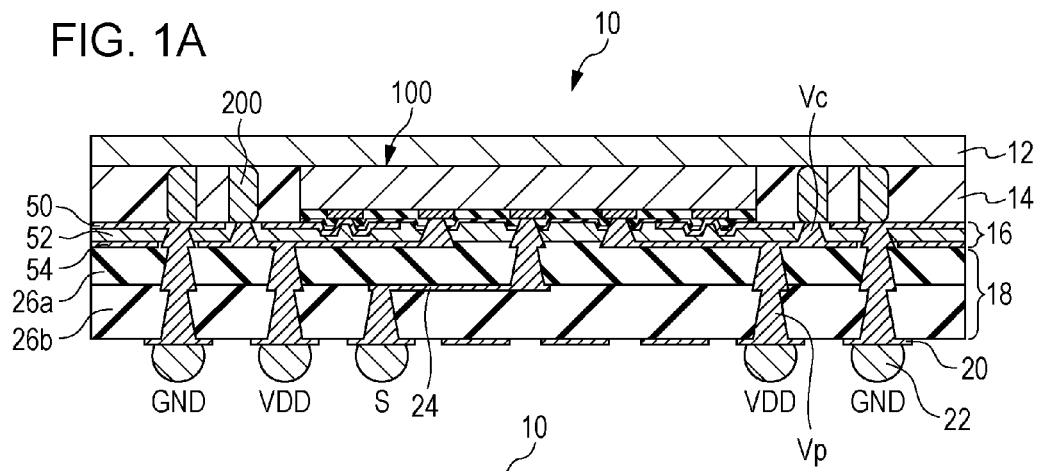
FIGS. 1A and 1B are, respectively, a vertical sectional view and a plan view of an exemplary structure of a semiconductor package according to a first exemplary embodiment.
Figure 1B:
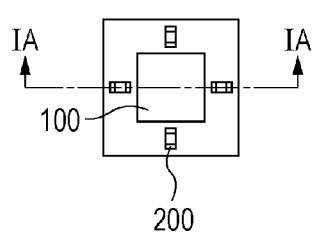

First, with reference to FIGS. 1A and 1B, an overall structure of a semiconductor package 10 according to the exemplary embodiment is described. FIG. 1A is a vertical sectional view of an exemplary structure of the semiconductor package 10. FIG. 1B is a plan view of the exemplary structure of the semiconductor package 10. The vertical sectional view of the semiconductor package 10 shown in FIG. 1A is a sectional view along line IA-IA in the plan view of the semiconductor package 10 shown in FIG. 1B.

As shown in FIG. 1A, the semiconductor package 10 according to the exemplary embodiment includes a base 12, an insulator layer 14, a capacitor layer 16, and a substrate 18. The semiconductor package 10 includes on one side thereof the base 12, and individual components, such as a semiconductor element 100 and a capacitor element 200, that contact the base 12 and that are placed on a large scale integrated circuit (LSI). The semiconductor package 10 includes on the other side thereof protruding connecting members, such as bumps 22. The semiconductor package 10 according to the exemplary embodiment is, for example, for mounting elements that are mounted on a printed circuit board (not shown), such as a mother board, through the bumps 22.

Examples of materials of the base 12 include a semiconductor substrate, such as a silicon (Si) substrate; a glass epoxy substrate; a ceramic substrate; and a metallic substrate. However, the materials of the base 12 are not limited to certain materials. In the exemplary embodiment, a silicon substrate is used for the base 12. As described below, in the exemplary embodiment according to the present invention, the base 12 may be removed by, for example, separating the base 12. In this case, for example, a metallic substrate is used.

The insulator layer 14 is a mold layer that encapsulates and secures the individual components, such as the semiconductor element 100 and the capacitor element 200. In the exemplary embodiment, the insulator layer is made of a resin.

As shown in FIG. 1A, the capacitor layer 16 includes a first metal layer 50, a dielectric layer 52, and a second metal layer 54. A portion where the first metal layer 50, the dielectric layer 52, and the second metal layer 54 that overlap each other in a stacking direction (in an up-down direction in front view in FIG. 2) constitutes a capacitor (capacitance). In the exemplary embodiment, the first metal layer 50 is a reference potential layer (layer where a reference potential terminal of each element that is mounted in the semiconductor package 10 is connected); and the second metal layer 54 is a power supply potential layer (layer where a power supply terminal of each element that is mounted in the semiconductor package 10 is connected). In other words, the first metal layer 50 functions as a reference potential layer, and the second metal layer 54 functions as a power supply potential layer. However, the functions of the first metal layer 50 and the second metal layer 54 are obviously not limited thereto. The first metal layer 50 may function as a power supply potential layer, and the second metal layer 54 may function as a reference potential layer. In the description below, the term "reference potential" is exemplified for the case in which the reference potential corresponds to ground.

In the exemplary embodiment, copper (Cu) is used as a metal that makes up the first metal layer 50 and the second metal layer 54. However, the metal is not limited thereto. Other metals that are used in general wiring, such as gold (Au) or aluminum (Al), may also be used. In the exemplary embodiment, STO (strontium titanate ($SrTiO_3$)) is used as a dielectric that makes up the dielectric layer 52. STO has a relative dielectric constant of approximately 300, and is a suitable material as a dielectric that makes up the capacitor. Alternatively, a ferroelectric material, such as barium titanate ($BaTiO_3$), may also be used. However, the dielectric that makes up the capacitor layer 16 is not limited thereto. Any material may be used as along as it is a dielectric material that functions as a capacitor layer. An example thereof that may be used is a material whose relative dielectric constant is higher than that of a material that makes up an interlayer insulating layer of the substrate.

The substrate 18 is a multilayer wiring layer including insulator layers 26a and 26b (hereunder generally referred to as "insulator layer 26") and wires 24 that are formed on top surfaces of the respective insulator layers 26a and 26b. In the exemplary embodiment, Cu is used as a metal that makes up the wiring layer. However, the metal is not limited thereto. Other metals that are used in general wiring, such as Au and Al, may be used. The insulator layer 26 may be made of, for example, a silicon oxide film ($SiO_2$ film). Although, in the exemplary embodiment, the multilayer wiring layer is described as an example of the substrate 18, the substrate may obviously be a single wiring layer. The substrate 18 is formed by performing steps that are the same as the steps of producing a wiring layer in a semiconductor producing process.

Pads 20 (electrode regions), which are portions of the wires 24, are formed on a surface of the substrate 18. The bumps 22, which are connecting members, are formed on the pads 20. The bumps 22 are not required. When, for example, the semiconductor package 10 is soldered and connected to a mother board (not shown), the bumps 22 need not be used.

Figure 1C:
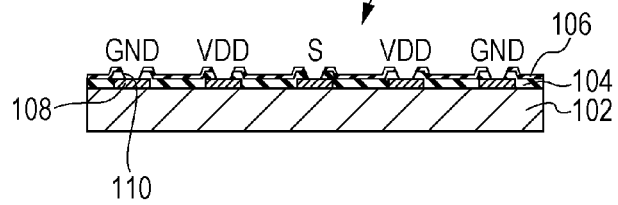
FIGS. 1C and 1D are each a vertical sectional view of a semiconductor device.

FIG. 1C illustrates the semiconductor element 100, which is an exemplary semiconductor element according to the exemplary embodiment. The semiconductor element 100 includes a diffusing substrate 102, pads 108 (connection regions) that are formed on the diffusing substrate 102, and insulating layers 104 and 106 that are formed around the pads 108. Openings 110 are formed in top portions of the respective pads 108 so as to extend through the insulating layers 104 and 106.

Although, in the exemplary embodiment, the semiconductor element 100 including the two insulating layers, that is, the insulating layer 104 and the insulating layer 106, is exemplified, the semiconductor element 100 is not limited to such a type. The semiconductor element 100 may be one including one insulating layer.

The diffusion substrate 102 is a substrate in which diffusion for forming elements, such as transistors, is completed. In the semiconductor element 100, a required wiring layer is further formed on the diffusion substrate 102. However, in FIG. 1C, the pads 108 are illustrated as representing the wiring layer.

The pads 108 are connection regions for connection to power supplies of the semiconductor element 100 (denoted by "VDD" in FIGS. 1A and 1C), connection to ground (denoted by "GND" in FIGS. 1A and 1C), and connection to signals (denoted by "S" in FIGS. 1A and 1C).

As shown in FIG. 1A, the pads 108 for connection to the GNDs of the semiconductor element 100 shown in FIG. 1C are directly connected to the first metal layer 50 (GNDs) of the capacitor layer 16. In addition, as shown in FIG. 1A, the pads 108 for connection to the VDDs of the semiconductor element 100 shown in FIG. 1C are connected to the second metal layer 54 (VDDs) of the capacitor layer 16 via corresponding vias Vc functioning as exemplary electrical conducting portions. The first metal layer 50 to which the pads 108 for connection to the GNDs are connected and the second metal layer 54 to which the pads 108 for connection to the VDDs are connected are further connected to the pads 20 via corresponding vias Vp in the substrate 18 and the respective wires 24 at the substrate 18. The pads 108 for connection to the signals S extend through the capacitor layer 16, and are connected to the pads 20 via corresponding vias Vp in the substrate 18 and the corresponding wires 24 at the substrate 18.

Here, in the exemplary embodiment, the interval between the pads 108 of the semiconductor element 100 is increased to the interval between the pads 20 by interposing the substrate 18 therebetween. Therefore, the semiconductor package 10 according to the exemplary embodiment has a so-called interposer function. In other words, the semiconductor package 10 is a so-called fan-out package.

The capacitor element 200 according to the exemplary embodiment is a capacitor that is provided for supplying excess electric current (for example, alternating current that flows when a circuit in the semiconductor element 100 is switched) to the semiconductor element 100. For example, a multi-layer ceramic capacitor (MLCC) of a low equivalent series inductance (ESL) type may be used for the capacitor element 200.

The capacitor element 200 includes a first terminal and a second terminal serving as a plus-side terminal and a minus-side terminal. One of the terminals is directly connected to the first metal layer 50 (GNDs) of the capacitor layer 16, and the other terminal is connected to the second metal layer 54 (VDDs) via the vias Vc. The number of first terminals and the number of second terminals may be one or more than one. Multiple terminals (terminal strips), such as three terminals, four terminals, or eight terminals may be used. Mounting components (circuit elements) are not limited to a semiconductor element and a capacitor element. Other elements, such as an inductor element and a resistance element, are sometimes mounted.

Here, the relationship between the capacitor layer 16 and the capacitor element 200 according to the exemplary embodiment is described. In the semiconductor package 10 having the above-described structure, the capacitor layer 16 is formed in the form of a sheet so as to surround the semiconductor element 100 and the capacitor element 200. Therefore, the capacitor layer 16 not only functions as a supply source that supplies excess electric current to the semiconductor element 100, but also functions as a low impedance line through which excess electric current is supplied from the capacitor element 200 to the semiconductor element 100. That is, compared to a structure in which excess electric current is supplied only through wires, electric current is supplied at low impedance from the capacitor element 200.

Figure 1D:
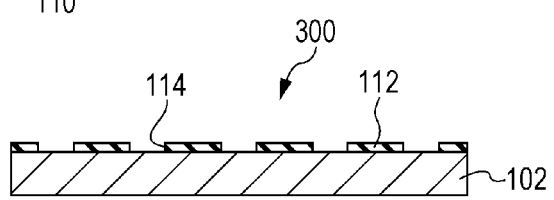

Although, in the exemplary embodiment, a form in which the semiconductor package 10 using the semiconductor element 100 whose wiring has been completed (wired semiconductor element) is exemplified and described, other forms may be used. A semiconductor element in which up to diffusion has been completed and wiring is not completed (unwired semiconductor element) may be used. FIG. 1D illustrates, as an exemplary unwired semiconductor element, a semiconductor element 300. As shown in FIG. 1D, the semiconductor element 300 includes, for example, an insulating layer 112 formed on a diffusion substrate 102, with the insulating layer 112 having openings 114 through which connection wires are introduced. A surface of the diffusion substrate 102 that is divided by the openings 114 corresponds to a connection region for connection to the capacitor layer 16.

As described above, in the semiconductor package 10 using the semiconductor element 100 (which is a wired semiconductor element), by using the wires 24 at the substrate 18, a portion from the pads 108 of the semiconductor element 100 to the pads 20 are wired, and a portion from the capacitor layer 16 to the pads 20 are wired. In contrast, in a semiconductor package using the semiconductor element 300 (which is an unwired semiconductor element), by using wires 24 at the substrate 18, wiring on the diffusion substrate 102 is also actually performed in addition to wiring from the openings 114 in the semiconductor element 300 to pads 20 and wiring from a capacitor layer 16 to pads 20.

Wiring of mounting components (such as the semiconductor element 100 and the capacitor element 200 in the exemplary embodiment) by wires 24 at the substrate 18 is generally called "rewiring". In the semiconductor package 10 using the wired semiconductor element 100, it is possible to use an existing semiconductor element, and rewiring allows a signal and power supply take-out position to be easily changed. In contrast, in the semiconductor package 10 using the unwired semiconductor element 300, rewiring is performed by performing a wiring step of a semiconductor producing process in which production precisions (such as, wire pitch) are relaxed.

In semiconductor packages according to related arts, for example, in a semiconductor package that includes a capacitor layer on a multilayer substrate and a semiconductor element and a coupling capacitor element mounted on the capacitor layer, C4 bumps may be used to mount the semiconductor element, and solder may be used to connect the capacitor element. However, in such a semiconductor package, parasitic impedance arising from the C4 bumps or the solder (parasitic inductance, parasitic capacitance, parasitic resistance) are not negligible. In particular, properties in semiconductor elements that handle high frequencies are largely affected by the parasitic impedance. When a structure in which a capacitor layer is provided near the center of a substrate in a thickness direction is used, the capacitor layer and the semiconductor element that are provided at a surface of the substrate need to be connected through a long via. As a result, the parasitic impedance is increased accordingly.

Accordingly, in the semiconductor package according to the exemplary embodiment of the present invention, with the positions of the top surfaces of mounting components, such as the semiconductor element and the capacitor element, being at the same height, the capacitor layer is formed at a side of the top surfaces of the mounting components; and the mounting components, such as the semiconductor element and the capacitor element, are directly connected to at least one of the metal layers of the capacitor layer. This reduces the parasitic impedance in the structure in which electric current is supplied to the semiconductor element from the capacitor element via the capacitor layer. In the description below, planarizing of a surface extending from the pads 108 of the semiconductor element 100 to the terminals of the capacitor element 200 by filling spaces between the mounting components, such as the semiconductor element and the capacitor element, with the insulator layer is called "planarization". The surface that has been planarized is sometimes referred to as "cofaces P". Cases of planarization include any cases as along as a surface is flatter than a surface in which spaces between the mounting components are not filled with the insulator layer. It is desirable that the following case be included, that is, a case in which, in FIG. 1E, differences between the positions of the pads 108 of the semiconductor element 100, the positions of the top surfaces of the terminals of the capacitor element 200, and the position of the top surface of the insulator layer 14 in a height direction are in the height range of 10 µm. It is more desirable that a case in which differences are in the height range of 3 µm be included. In the exemplary embodiment, expressions, such as "at the same height" and "aligned with each other" do not mean "at exactly the same height" and "exactly aligned with each other". These expressions refer to at least differences in the height range of 10 µm, and desirably to differences in the height range of 3 µm.

Figure 1E:
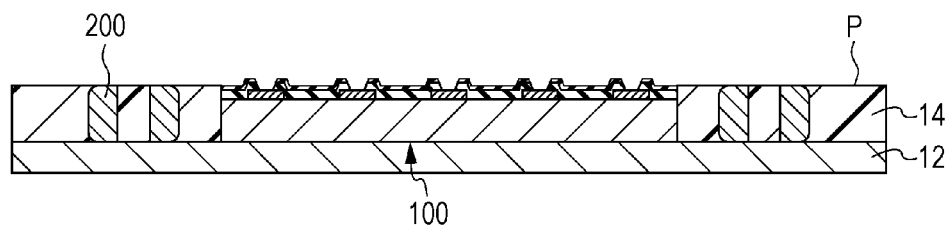
FIG. 1E illustrates planarization of a surface of the semiconductor package.

FIG. 1E illustrates an example of the planarization described above. That is, in the exemplary embodiment, the positions of the top surfaces of the semiconductor element 100 and the capacitor element 200, which are mounting components on the base 12, and the position of the top surface of the insulator layer 14 are at the same height. That is, the positions of the cofaces P are aligned with each other. As described below, there are various planarization methods for causing the positions of the top surfaces of the mounting components to be aligned at the positions of the cofaces P. In the exemplary embodiment, the planarization is performed by aligning the position of the semiconductor element 100 and the position of the capacitor element 200 in the height direction.

That is, the planarization is performed by, with the height of the capacitor element 200 being a given height, aligning the position of the semiconductor element 100 with the position of the capacitor element 200 in the height direction, and filling the spaces between the capacitor element 200 and the semiconductor element 100 with the insulator layer 14. In an exemplary method of adjusting the position of the semiconductor element 100 in the height direction, the position of the semiconductor element 100 in the height direction may be adjusted by only polishing the diffusion substrate 102 by a required amount in a step of producing the semiconductor element 100. Obviously, other methods may be used to adjust the position in the height direction. Accordingly, the planarization may be performed by aligning the position of the capacitor element 200 with the position of the semiconductor element 100 in the height direction.

Figure 3A:
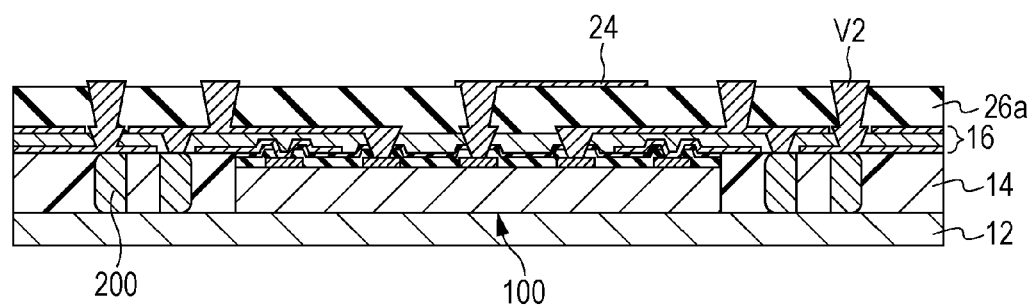
FIGS. 3A and 3B are some vertical sectional views of the exemplary method of producing the semiconductor package according to the first exemplary embodiment.
Figure 3B:
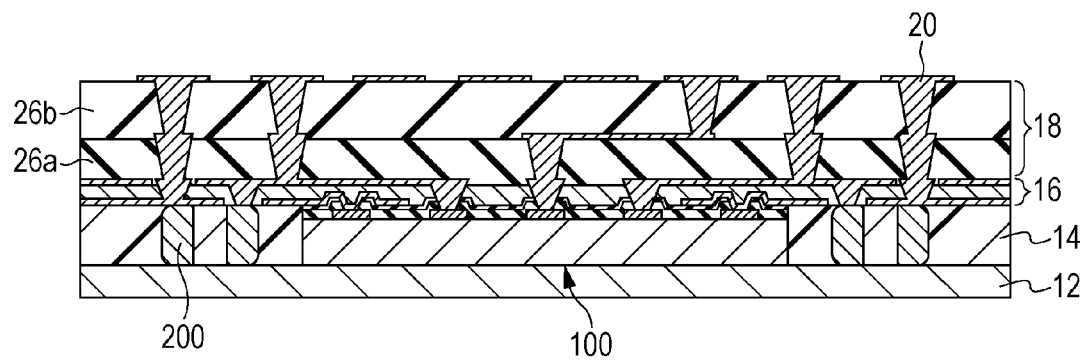
Figure 4A:
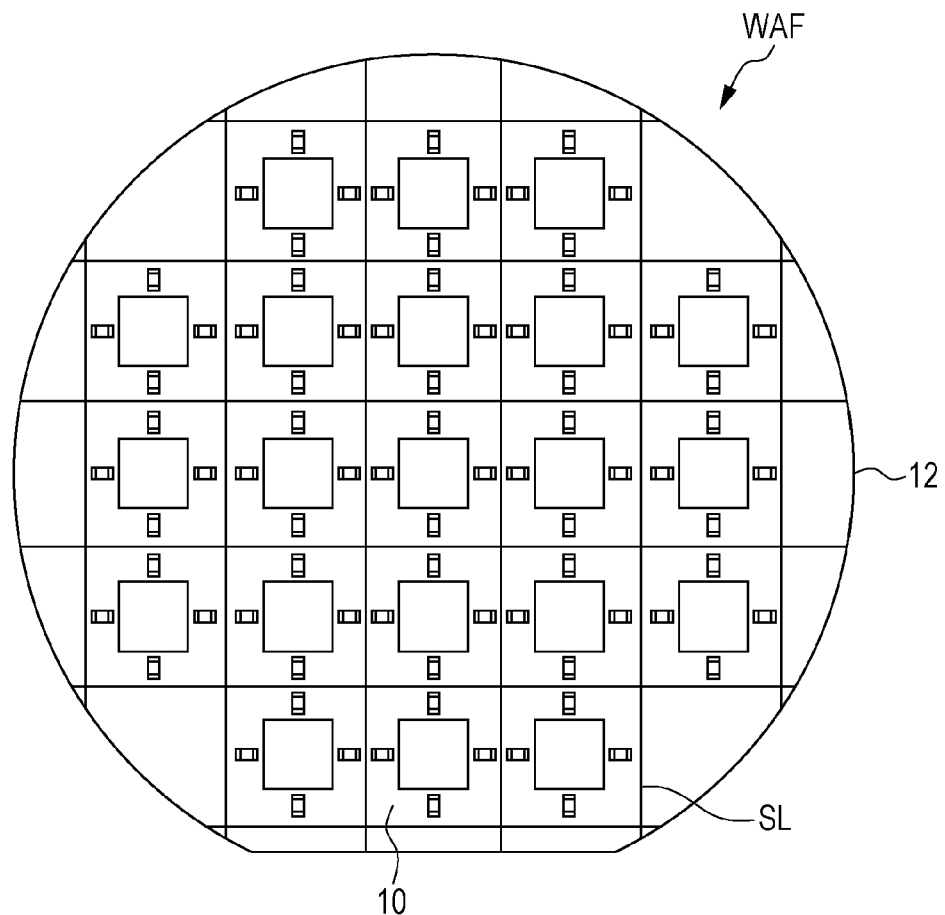
FIGS. 4A and 4B are, respectively, a plan view of an exemplary structure of semiconductor packages according to the first exemplary embodiment before the semiconductor packages are separated into individual pieces, and a plan view thereof after the semiconductor packages are separated into individual pieces.
Figure 4B:
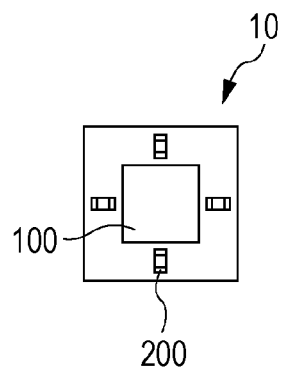

Next, with reference to FIGS. 2A to 4B, a method of producing the semiconductor package according to the exemplary embodiment is described. FIGS. 2A to 3B are vertical sectional views of an exemplary method of producing the semiconductor package according to the exemplary embodiment. FIGS. 4A and 4B are, respectively, a plan view of an exemplary structure of produced semiconductor packages according to the exemplary embodiment before the semiconductor packages are separated into individual pieces, and a plan view thereof after the semiconductor packages are separated into individual pieces.

Figure 2A:
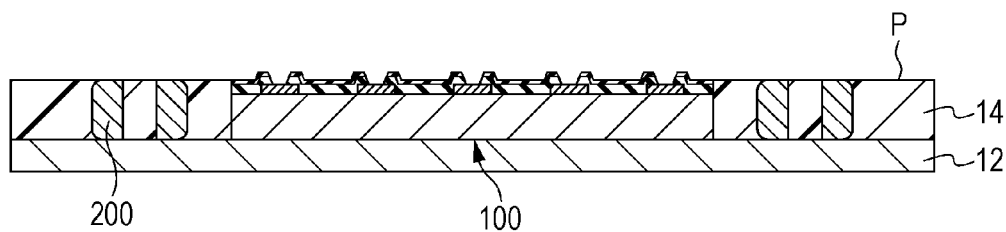
FIGS. 2A to 2D are some vertical sectional views of an exemplary method of producing the semiconductor package according to the first exemplary embodiment.

First, the semiconductor element 100 and the capacitor element 200, which are mounting components, are disposed on the base 12 by securing them to the base 12 with, for example, an adhesive. Then, as shown in FIG. 2A, a mold resin is put around the semiconductor element 100 and the capacitor element 200 to form the insulator layer 14. This causes the cofaces P to be formed. When the semiconductor element 100 and the capacitor element 200 are to be separated from the base 12 in a post-process, for example, a separable adhesive may be used; and when the semiconductor package is used without separating the semiconductor element 100 and the capacitor element 200 from the base 12, the semiconductor element 100 and the capacitor element 200 may be secured to the base 12 with an adhesive other than a separable adhesive.

With reference to FIG. 4A, a method of disposing the mounting components according to the exemplary embodiment is described in more detail. In the exemplary embodiment, a silicon substrate is used as the base 12. Therefore, in the present step, for example, as shown in FIG. 4A, mounting components for forming multiple semiconductor packages 10 are regularly disposed on a wafer WAF made of silicon. By using such a step, the multiple semiconductor packages 10 (21 semiconductor packages 10 in the example shown in FIG. 4A) are produced all together.

Figure 2B:
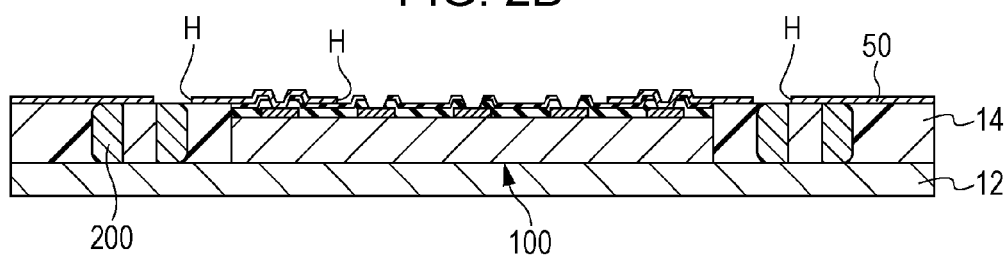

Next, a metallic film for forming the first metal layer 50 is deposited. As materials of the metallic film, Cu, Au, Al, etc., are used without being limited to certain materials. However, in the exemplary embodiment, Cu is used. The metallic film is deposited to a thickness of, for example, approximately 1 μm to 20 μm by sputtering, dry plating, or the like. Thereafter, as shown in FIG. 2B, by performing photolithography and etching, the metallic film is patterned into a predetermined shape to form the first metal layer 50. By the present etching step, openings H that are positioned where the mounting components are connected are formed. Examples of the etching include dry etching and wet etching, and are not particularly limited to certain etching examples. Alternatively, the metallic film may be patterned to form the first metal layer 50 without performing etching by other methods of forming the first metal layer 50, such as mask vapor deposition or lift-off.

Figure 2C:
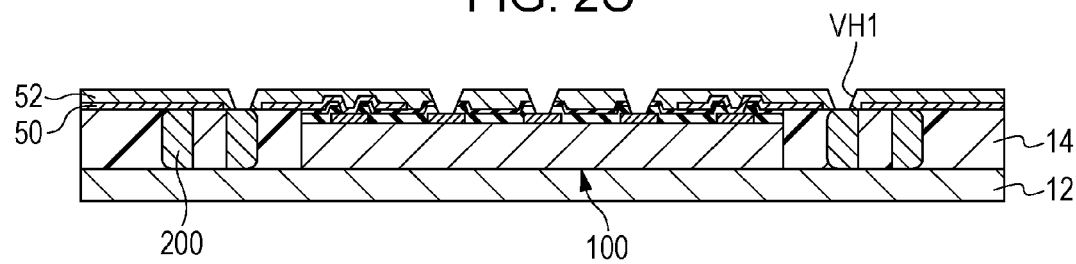
Figure 2D:
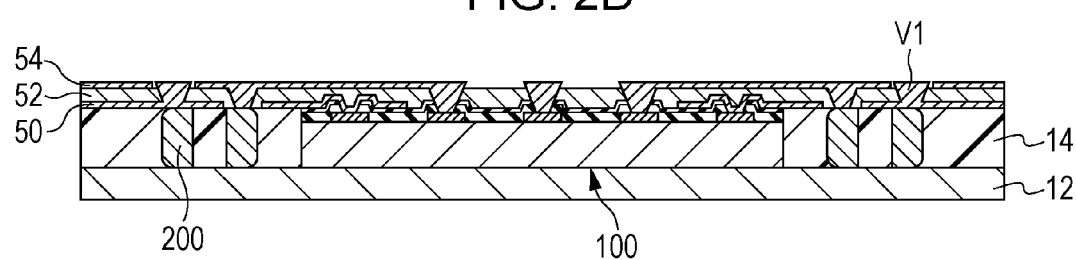

Next, a dielectric film for forming the dielectric layer 52 is formed on the first metal layer 50. By performing photolithography and etching, the dielectric film is patterned into a predetermined shape. Examples of the etching include dry etching and wet etching, and are not particularly limited to certain etching examples. Thereafter, using, for example, a laser device or a drill, via holes VH1 are formed in the positions where the mounting components are connected. As a result, as shown in FIG. 2C, the dielectric layer 52 is formed.

Here, in the exemplary embodiment, as the dielectric layer 52, for example, an STO film is used. The STO film is deposited by, for example, a chemical vapor deposition (CVD) method or a physical vapor deposition (PVD) method. More specifically, the STO film is deposited to a thickness of approximately a few hundred nm to a few μm by a vapor deposition method, such as a plasma CVD method, an aerosol CVD method, a sputtering method, an ion plating method, or an evaporation method. For example, the STO film is deposited to a thickness of approximately 500 nm. If the dielectric layer 52 is deposited by such a vapor deposition method, since the dielectric layer 52 is capable of being formed to a very small thickness, even if the area of the dielectric film 52 is unchanged, the capacitance is increased. Instead of a vapor deposition method, other methods of forming the dielectric film, such as an STO film, may be used. Examples of such other methods include a solution method of applying a solution, and a method of attaching a dielectric film although in this method the dielectric film becomes thick.

Next, a metallic film for forming the second metal layer 54 is deposited. As materials of the metallic film, Cu, Au, Al, etc., are used without being particularly limited to certain materials. However, in the exemplary embodiment, Cu is used. The metallic film is formed by forming a thin CU film (seed layer) by, for example, a dry plating method performed over the entire surface including the inner portions of the via holes VH1 (this step is not shown). Here, the "seed layer" refers to a layer that becomes a conductor when, in a post-process, the second metal layer 54 is formed by a plating process. Then, after performing patterning on the seed layer using a photoresist, a metallic film is formed in portions where the seed layer is exposed from openings in the photoresist by, for example, electroplating. By, for example, the electroplating, the via holes VH1 are filled with the metallic film, and become the vias V1 (which are exemplary conducting portions), and the second metal layer 54 is formed. That is, the formation of the second metal layer 54, and the filling of the via holes VH1 with the metallic film are performed at the same time in the same step. Thereafter, the photoresist is removed, and etching is performed by an amount corresponding to the thickness of the seed layer, so that a portion of the seed layer where the second metal layer 54 is not formed is removed to complete the final second metal layer 54. Accordingly, compared to a case in which the second metal layer 54 and the vias V1 are formed using different materials in different steps, the parasitic impedance between the pads 108 of the semiconductor element 100 and the terminals of the capacitor element 200 and the second metal layer 54 may be reduced. The thickness of the second metal layer 54 is, for example, approximately 1 μm to 20 μm.

Next, after the insulator layer 26a is formed, by performing photolithography and etching, openings for forming the vias V2 in required locations are formed, after which a metallic film is deposited on the insulating layer 26a. The openings are filled with the metallic film by the present deposition step, so that the vias V2 are formed. Thereafter, by performing photolithography and etching, the metallic film is patterned into a predetermined shape, so that, as shown in FIG. 3A, the wires 24 are formed.

Next, the insulator layer 26b is formed on the insulator layer 26a and the wires 24. By a step that is similar to a previous step, the pads 20 are formed on the insulator layer 26b. The base 12 may be separated (removed) during either of the above-described steps, or may remain as part of the semiconductor package without being separated therefrom. By separating the base 12, the height of the semiconductor package tends to be reduced. Further, the base 12 that has been separated from the semiconductor package may be used again in producing a different semiconductor package.

By the foregoing steps, semiconductor packages 10 according to the exemplary embodiment before the semiconductor packages 10 are separated into individual pieces (shown in FIG. 4A) are produced. Thereafter, the semiconductor packages 10 are cut along cutting lines SL by, for example, a dicer or a laser device, so that individual pieces of semiconductor packages 10 are produced. FIG. 4B is a plan view of an individual semiconductor package 10.

Second Exemplary Embodiment

Figure 5A:
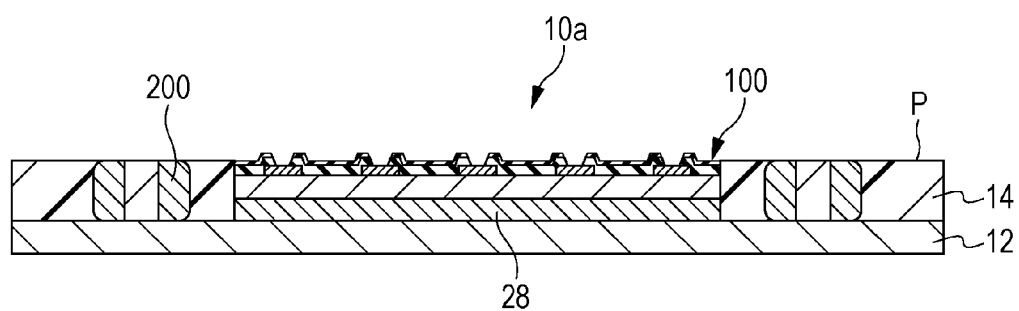
FIGS. 5A and 5B are each a vertical sectional view of an exemplary structure of a semiconductor package according to a second exemplary embodiment.
Figure 5B:
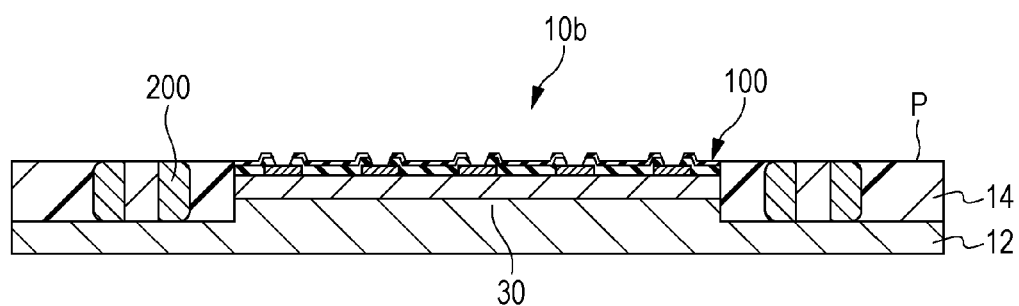

With reference to FIGS. 5A and 5B, a semiconductor package 10a according to a second exemplary embodiment is described. Although, in the first exemplary embodiment, the planarization method for forming the top surfaces of the mounting components as cofaces P is performed by aligning the positions of the mounting components with each other in a height direction, a different planarization method is performed in the second exemplary embodiment.

FIG. 5A is a vertical sectional view of an exemplary structure of the semiconductor package 10a. In FIG. 5A, the capacitor layer 16 and the substrate 18 shown in FIG. 1A are not shown. As shown in FIG. 5A, with the height of a semiconductor element 100 assumed as being greater than the height of a capacitor element 200, the semiconductor package 10a includes a spacer 28 (aligning portion) having a thickness that is equal to the difference between the height of the semiconductor element 100 and the height of the capacitor element 200. That is, in the semiconductor package 10a, a surface is planarized by causing the position of the top surface of the semiconductor element 100 and the position of the top surface of the capacitor element 200 to be at the same height and putting an insulator layer 14 in portions between the semiconductor element 100 and the capacitor element 200. The spacer 28 may be made of, for example, a resin or a metal. Obviously, when the height of the capacitor element 200 is less than the height of the semiconductor element 100, the spacer 28 is provided at a lower portion of the capacitor element 200.

The semiconductor package 10a is produced by a method that is the same as the method used to produce the semiconductor package 10 shown in FIGS. 2A to 3B. That is, in the step shown in FIG. 2A, before securing the semiconductor element 100 to a base 12 with an adhesive or the like, the spacer 28 is secured to the base 12 with an adhesive, and the semiconductor element 100 is secured to the secured spacer 28 with an adhesive or the like. By the same steps shown in FIGS. 2A to 3B, a capacitor layer 16 and a substrate 18 are formed on a structural body shown in FIG. 5A to produce the semiconductor package 10a.

Since, according to the semiconductor package 10a, the planarization method is capable of being performed without, for example, polishing the back surface of the semiconductor element 100, the semiconductor package 10a may be more easily produced.

FIG. 5B is a vertical sectional view of an exemplary structure of a semiconductor package 10b. In FIG. 5B, the capacitor layer 16 and the substrate 18 shown in FIG. 1A are not shown. As shown in FIG. 5B, with the height of a semiconductor element 100 assumed as being greater than the height of a capacitor element 200, the semiconductor package 10b includes a protrusion 30 (aligning portion) having a thickness that is equal to the difference between the height of the semiconductor element 100 and the height of the capacitor element 200 and being integrally formed with a base 12. That is, in the semiconductor package 10b, a surface of the semiconductor package 10b is planarized by forming the top surface of the semiconductor element 100 and the top surface of the capacitor element 200 as cofaces P by the protrusion 30. Obviously, when the height of the capacitor element 200 is less than the height of the semiconductor element 200, the protrusion 30 is provided at a lower portion of the capacitor element 200.

The semiconductor package 10b is produced by a method that is the same as the method used to produce the semiconductor package 10 shown in FIGS. 2A to 3B. That is, in the step shown in FIG. 2A, the semiconductor element 100 is secured to the base 12 including the protrusion 30 with, for example, an adhesive. By the same steps shown in FIGS. 2A to 3B, a capacitor layer 16 and a substrate 18 are formed on a structural body shown in FIG. 5B to produce the semiconductor package 10b.

Since, according to the semiconductor package 10b, the planarization method is capable of being performed without, for example, polishing the back surface of the semiconductor element 100 and without providing a different component, such as a spacer 28, the semiconductor package 10b may be more easily produced.

Third Exemplary Embodiment

Figure 6A:
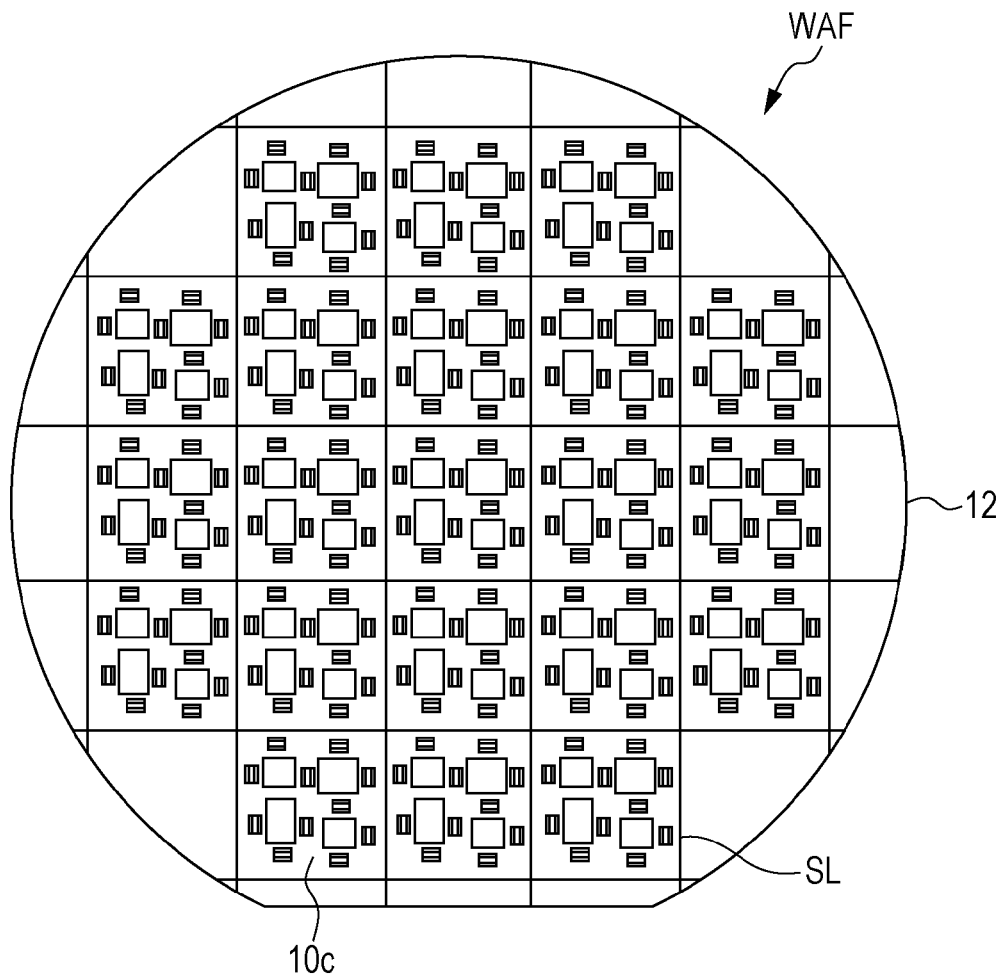
FIGS. 6A and 6B are, respectively, a plan view of an exemplary structure of semiconductor packages according to a third exemplary embodiment before the semiconductor packages are separated into individual pieces, and a plan view thereof after the semiconductor packages are separated into individual pieces.
Figure 6B:
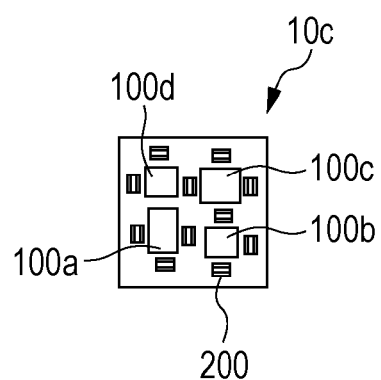

With reference to FIGS. 6A and 6B, semiconductor packages 10c according to a third exemplary embodiment are described. In the third exemplary embodiment, multiple semiconductor elements 100, which are mounting components, are formed. FIG. 6A illustrates semiconductor packages 10c before they are separated into individual pieces, and FIG. 6B illustrates a semiconductor package 10c after the semiconductor packages 10c are separated into individual pieces.

As shown in FIG. 6B, the semiconductor package 10c includes semiconductor elements 100a, 100b, 100c, and 100d, and multiple capacitor elements 200 that are provided in correspondence with the semiconductor elements. Although not shown, even in the semiconductor package 10c, planarization of a surface of the semiconductor package 10c is performed by forming the top surfaces of the semiconductor elements 100a, 100b, 100c, and 100d and the top surfaces of the capacitor elements 200 as cofaces P. The semiconductor package 10c may be formed as a system in package (SiP) in which multiple chips, such as a system on chip (SoC), a high-capacity memory chip, and a high-precision analog circuit chip, are connected to each other to realize a large system by one package. Here, "SoC" refers to a technology in which, for example, multiple functional circuits are formed on a silicon chip to form a system by one chip.

The semiconductor package 10c is also produced by a method that is the same as the producing method shown in FIGS. 2A to 3B with a silicon wafer WAF being an exemplary base and each mounting component being disposed on the wafer WAF. The capacitor layer 16 is also produced by the same producing method. FIG. 6A shows a state of the wafer WAF after the production of semiconductor packages 10c is completed. By cutting the wafer WAF along cutting lines SL into individual pieces, an individual semiconductor package 10c shown in FIG. 6B is produced.

Fourth Exemplary Embodiment

Figure 7:
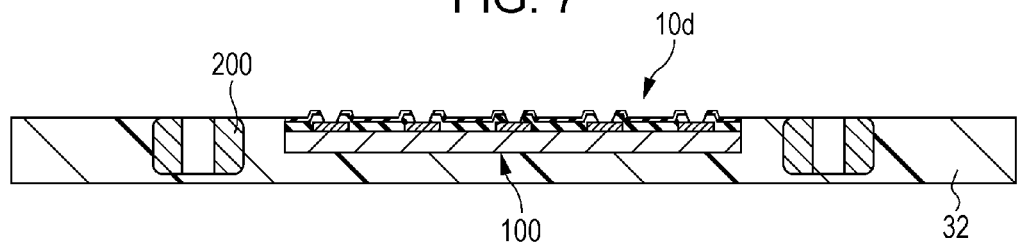
FIG. 7 is a vertical sectional view of an exemplary structure of a semiconductor package according to a fourth exemplary embodiment.
Figure 8A:
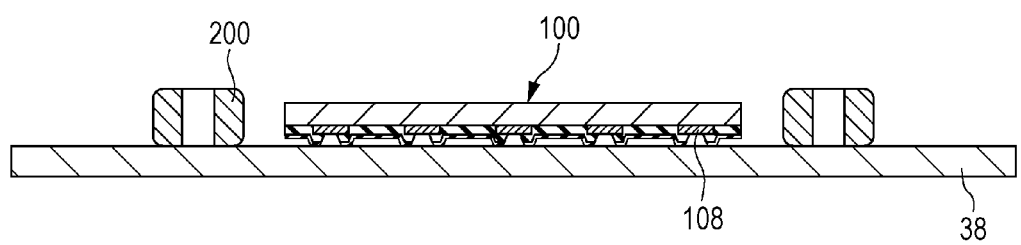
FIGS. 8A to 8C are vertical sectional views of an exemplary method of producing the semiconductor package according to the fourth exemplary embodiment.
Figure 8B:
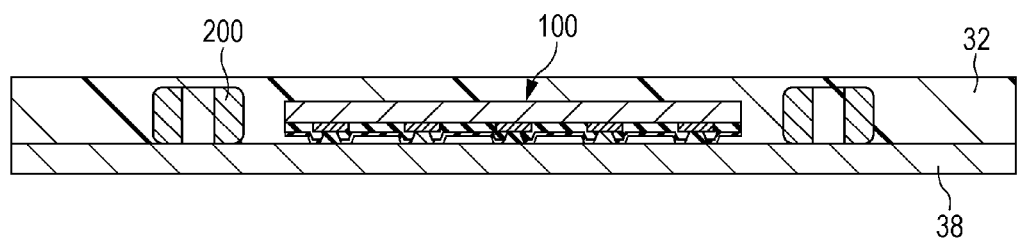
Figure 8C:
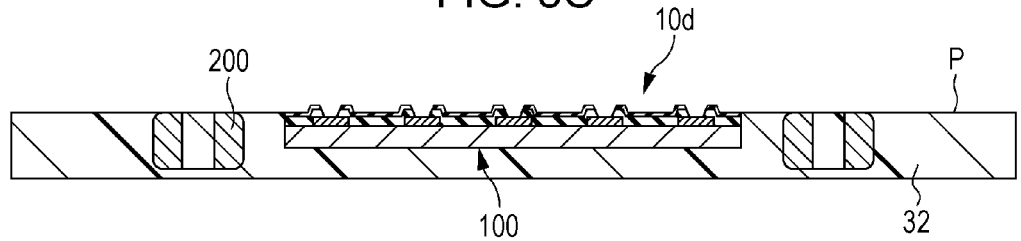

With reference to FIGS. 7 to 8C, a semiconductor package 10d according to a fourth exemplary embodiment is described. The semiconductor package 10d according to the fourth exemplary embodiment is a semiconductor package having a core-less structure.

FIG. 7 is a vertical sectional view of an exemplary structure of the semiconductor package 10d. However, FIG. 7 does not show the capacitor layer 16 and the substrate 18 shown in FIG. 1A. As shown in FIG. 7, the semiconductor package 10d has a structure in which a base on which mounting components, such as a semiconductor element 100 and a capacitor element 200, are mounted is not provided, and in which at least part of the semiconductor element 100 and part of the capacitor element 200 are embedded in an insulator layer 32 made of, for example, mold resin.

With reference to FIGS. 8A to 8C, a method of producing the semiconductor package 10d according to the fourth exemplary embodiment is described.

As shown in FIG. 8A, first, the semiconductor element 100 and the capacitor element 200 are disposed on a base 38, and are secured thereto with, for example, an adhesive that is separable in a post-process. Here, the semiconductor element 100 is disposed with pads 108 facing the base 38, that is, face down.

Next, as shown in FIG. 8B, the mold resin is applied to the base 38 and hardened so as to embed the semiconductor element 100 and the capacitor element 200 therein, to form the insulator layer 32.

Next, as shown in FIG. 8C, the base 38 is separated. Thereafter, the capacitor layer 16 and a substrate 18 are formed on a structural body shown in FIG. 8C by steps that are the same as those shown in FIGS. 2A to 3B, to produce the semiconductor package 10d. The separated base 38 may be reused in producing a different semiconductor package 10d.

The semiconductor package 10d according to the fourth exemplary embodiment does not include the base, and is, thus, smaller, and allows the height of, for example, a motherboard on which the semiconductor package 10d is mounted to be reduced.

Fifth Exemplary Embodiment

Figure 9:
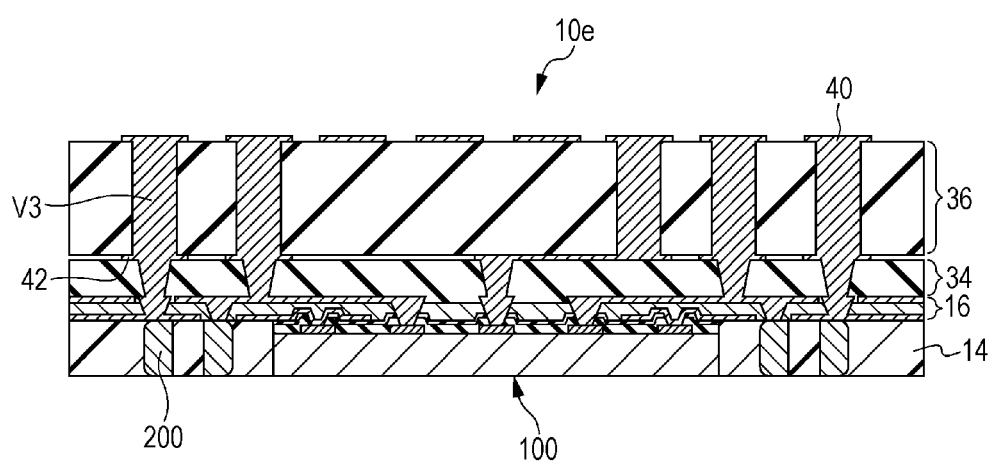
FIG. 9 is a vertical sectional view of an exemplary structure of a semiconductor package according to a fifth exemplary embodiment.

With reference to FIG. 9, a semiconductor package 10e according to a fifth exemplary embodiment is described. The semiconductor package 10e according to the fifth exemplary embodiment is a semiconductor package including a core layer.

As shown in FIG. 9, the semiconductor package 10e according to the fifth exemplary embodiment includes a semiconductor element 100 and a capacitor element 200 that are mounting components and surrounded by an insulator layer 14; a capacitor layer 16 that is formed on a top portion of a top surface of each mounting component, the top surfaces being formed as cofaces; a wiring layer 34 that is formed on top of the capacitor layer 16; and a core 36 that is disposed on top of the wiring layer 34.

A structural body (intermediate body) including the insulator layer 14, the capacitor layer 16, and the wiring layer 34 is a structural body that is the same as the semiconductor package 10 shown in FIG. 1A, and is produced by a method that is the same as the producing method shown in FIGS. 2A to 3B, except that, in the semiconductor package 10e shown in FIG. 9, the wiring layer 34 is a single layer, and a base 12 is separated. Obviously, the wiring layer 34 may be a multilayer wiring layer, and the base 12 need not be separated.

The material of the core 36 is not particularly limited to certain materials as long the material is a hard material, such as a glass epoxy resin or ceramic. However, in the fifth exemplary embodiment, a glass epoxy resin is used. The core 36 is formed by a step of producing an ordinary printed circuit board, that is, a step in which, after forming via holes (not shown) in required locations in a glass epoxy substrate at, for example, lead-out positions of terminals of mounting components, a metallic film made of Cu or the like is formed on both sides of the glass epoxy resin. Here, the via holes are filled with the metallic film to form vias V3. Thereafter, the metallic film is processed into a predetermined shape by etching or the like, and pads 40 (connecting portions) and pads 42 (wiring portions) are formed on two respective sides of the glass epoxy substrate, to produce the core 36.

In the fifth exemplary embodiment, pads 20 of the intermediate body (not shown; see FIG. 1A) and the pads 42 of the core 36 are connected to each other by bumps or by solder (not shown), and the production of the semiconductor package 10e is completed.

In the fifth exemplary embodiment, there is exemplified the case in which, after the intermediate body and the core 36 have been produced as separate bodies and the production of the intermediate body and the core 36 have been completed, both of them are joined to each other to produce the semiconductor package 10e. However, other methods are possible. For example, a method of producing a core by forming a wiring layer on top of an intermediate body layer may also be used. Here, an interlayer insulating film made of a thermosetting resin is used as the wiring layer.

According to the semiconductor package 10e according to the fifth exemplary embodiment, the strength of the entire semiconductor package may be increased by the core 36. Therefore, the semiconductor package 10e may be easy to handle.

Although, in the foregoing description, exemplary embodiments according to the present invention are described in detail, the present invention is not limited to specific exemplary embodiments. Various modifications and changes may be made within the scope of the gist of the present invention that is described in the claims. That is, for example, the structure, material, and processing that are described in a certain exemplary embodiment may be applied to another exemplary embodiment as long as there are no technical inconsistencies. For example, the coreless structure according to the fourth exemplary embodiment may be applied to the first exemplary embodiment and the third exemplary embodiment.

The capacitor layer including the first metal layer, the second metal layer, and the dielectric layer according to each of the exemplary embodiments need not be formed so as to extend along the periphery of the semiconductor element along the semiconductor package. The capacitor layer may be formed at only a location of a portion of the semiconductor package. For example, the capacitor layer may be formed as a wire having a width that is greater than or equal to 500 µm so as to be sufficiently wider than an ordinary wire. Alternatively, for example, if there is no space, the wire may have a width that is less than 500 µm. Still alternatively, one of the first metal layer 50 and the second metal layer 54 may have a planar metallic surface having a width that is greater than or equal to 500 µm, and the other of the first metal layer 50 and the second metal layer 54 may have a metallic surface having a width that is less than 500 µm.

The power supply potential layer and the reference potential layer in each of the exemplary embodiments may each be divided into multiple regions, or only one of the power supply potential layer and the reference potential layer may be divided in multiple regions.

Each metal layer of the capacitor layer need not be formed as a single layer. For example, a functional layer may be formed on a front surface or a back surface of each single metal layer that serves as a base layer, the functional layer being thinner than the corresponding metal layer.

Each figure scale and shapes in the figures are sometimes emphasized to make it easier to understand the characteristics of exemplary embodiments of the present invention. It should be noted that the substrates and layers in the figures are not necessarily shown in scales and with shapes that are the same as the scales in which and the shapes with which the actual substrates and layers are shown.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of producing a semiconductor package, comprising:
    planarizing a surface that extends from at least part of a plurality of connection regions to a pair of terminals by disposing a semiconductor element that includes the plurality of connection regions at a surface thereof and a capacitor element that includes the pair of terminals such that the semiconductor element and the capacitor element do not overlap each other in plan view of the semiconductor element, and by filling a portion between the semiconductor element and the capacitor element with an insulator layer, the capacitor element supplying electric current to the semiconductor element, the plurality of connection regions being where a circuit element is provided and being provided for connecting the circuit element to an outside, the pair of terminals being provided for connection to an outside;
    directly connecting part of the plurality of connection regions and one of the pair of terminals to a first metal layer by forming the first metal layer on top of the plurality of connection regions, on top of the pair of terminals, and on top of the insulator layer;
    forming a dielectric layer on top of the first metal layer; and
    forming a capacitor layer by forming a second metal layer on top of the dielectric layer, the capacitor layer including the first metal layer, the dielectric layer, and the second metal layer.

2. The method according to claim 1, wherein, in forming the second metal layer, another part of the plurality of connection regions and the other of the pair of terminals are connected to the second metal layer by an electrical conducting portion extending through the dielectric layer, and wherein the second metal layer and the electrical conducting portion are formed at the same time in a same step.

3. The method according to claim 1, further comprising disposing the at least part of the plurality of connection regions and the pair of terminals such that positions of the at least part of the plurality of connection regions and positions of the pair of terminals are at a same height in sectional view of the semiconductor element.

4. The method according to claim 1, further comprising disposing on a base a surface of the semiconductor element that is opposite to a surface of the semiconductor element on which the capacitor layer is formed and a surface of the capacitor element that is opposite to a surface of the capacitor element on which the capacitor layer is formed, and
    removing the base from the semiconductor element and the capacitor element after forming the capacitor layer.

5. A semiconductor package comprising:
    a semiconductor element that includes a plurality of connection regions on a surface thereof, the plurality of connection regions being where a circuit element is provided and being provided for connecting the circuit element to an outside;
    a capacitor element that is disposed so as not to overlap the semiconductor element in plan view of the semiconductor element, the capacitor element including a pair of terminals that supply electric current to the semiconductor element;
    an insulator layer that is provided between the semiconductor element and the capacitor element, and that planarizes a surface that extends from at least part of the plurality of connection regions to the pair of terminals; and
    a capacitor layer that includes a first metal layer, a dielectric layer, and a second metal layer, the first metal layer being formed on top of the plurality of connection regions, on top of the pair of terminals, and on top of the insulator layer, the dielectric layer being formed on top of the first metal layer, the second metal layer being formed on top of the dielectric layer,
    wherein part of the plurality of connection regions and one of the pair of terminals are directly connected to the first metal layer, and another part of the plurality of connection regions and the other of the pair of terminals are connected to the second metal layer by an electrical conducting portion extending through the dielectric layer.

6. The semiconductor package according to claim 5, further comprising a substrate that includes a plurality of electrode regions on one surface thereof, and a wiring region on the other surface thereof, the substrate being connected to a remaining part of the plurality of connection regions, the first metal layer, and the second metal layer via the wiring region, the plurality of electrode regions being provided for connection to an outside.

7. The semiconductor package according to claim 6, wherein the substrate includes one or a plurality of wiring layers between the one surface and the other surface of the substrate.

8. The semiconductor package according to claim 6, further comprising a core that includes a plurality of connecting portions at one surface thereof, and a wiring portion at the other surface thereof, the core being connected to the wiring region by the wiring portion.

9. The semiconductor package according to claim 5, wherein the plurality of connection regions are provided at part of a wiring layer disposed at a surface of the semiconductor element.

10. The semiconductor package according to claim 5, wherein the plurality of connection regions are predetermined regions on the surface of the semiconductor element.

11. The semiconductor package according to claim 5, further comprising a base on a back-surface side of the semiconductor element, the semiconductor element and the capacitor element being disposed on the base.

12. The semiconductor package according to claim 11, further comprising an aligning portion that is disposed between the base and the semiconductor element or between the base and the capacitor element, the aligning portion being provided to cause positions of the at least part of the plurality of connection regions and positions of the pair of terminals of the capacitor element to correspond with each other.

13. The semiconductor package according to claim 5, wherein a plurality of the semiconductor elements that have different functions are provided, and a plurality of the capacitor elements that are disposed in correspondence with the plurality of the semiconductor elements are provided, and wherein the plurality of the semiconductor elements are connected to each other so as to exhibit predetermined functions.

14. The semiconductor package according to claim 5, wherein the pair of terminals includes a plurality of terminal portions that are connected to an electrode of the corresponding capacitor element.

* * * * *